US010424638B2

(12) United States Patent
Zhang et al.

(10) Patent No.: US 10,424,638 B2
(45) Date of Patent: Sep. 24, 2019

(54) SEMICONDUCTOR DEVICE

(71) Applicants: Tsinghua University, Beijing (CN); HON HAI PRECISION INDUSTRY CO., LTD., New Taipei (TW)

(72) Inventors: Jin Zhang, Beijing (CN); Yang Wei, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 46 days.

(21) Appl. No.: 15/916,423

(22) Filed: Mar. 9, 2018

(65) Prior Publication Data
US 2018/0342578 A1  Nov. 29, 2018

(30) Foreign Application Priority Data
May 24, 2017 (CN) .......................... 2017 1 0375328

(51) Int. Cl.
*H01L 51/00* (2006.01)
*H01L 29/06* (2006.01)
(Continued)

(52) U.S. Cl.
CPC .......... *H01L 29/0673* (2013.01); *B82Y 30/00* (2013.01); *H01L 21/02425* (2013.01); *H01L 21/02488* (2013.01); *H01L 21/02491* (2013.01); *H01L 21/02502* (2013.01); *H01L 21/02513* (2013.01); *H01L 21/02521* (2013.01); *H01L 21/02631* (2013.01); *H01L 27/04* (2013.01);
(Continued)

(58) Field of Classification Search
CPC .................................................. H01L 51/0048
See application file for complete search history.

(56) References Cited

U.S. PATENT DOCUMENTS

2008/0178924 A1  7/2008  Kempa et al.
2009/0260679 A1  10/2009  Sun et al.
(Continued)

FOREIGN PATENT DOCUMENTS

CN  101667611 A  3/2010
CN  105489694 A  4/2016
(Continued)

Primary Examiner — Peniel M Gumedzoe
Assistant Examiner — Christopher A Johnson
(74) Attorney, Agent, or Firm — ScienBiziP, P.C.

(57) ABSTRACT

A semiconductor device includes a gate electrode, an insulating layer, a first carbon nanotube, a second carbon nanotube, a P-type semiconductor layer, an N-type semiconductor layer, a conductive film, a first electrode, a second electrode and a third electrode. The insulating layer is located on a surface of the gate electrode. The first carbon nanotube and the second carbon nanotube are located on a surface of the insulating layer. The P-type semiconductor layer and the N-type semiconductor layer are located on the surface of the insulating layer and apart from each other. The conductive film is located on surfaces of the P-type semiconductor layer and the N-type semiconductor layer. The first electrode is electrically connected with the first carbon nanotube. The second electrode is electrically connected with the second carbon nanotube. The third electrode is electrically connected with the conductive film.

12 Claims, 3 Drawing Sheets

(51) Int. Cl.
    *H01L 29/423*    (2006.01)
    *H01L 29/41*     (2006.01)
    *B82Y 30/00*     (2011.01)
    *H01L 21/02*     (2006.01)
    *H01L 29/16*     (2006.01)
    *H01L 29/66*     (2006.01)
    *H01L 29/417*    (2006.01)
    *H01L 27/04*     (2006.01)
    *H01L 51/05*     (2006.01)
    *H01L 29/786*    (2006.01)
    *B82Y 10/00*     (2011.01)

(52) U.S. Cl.
    CPC ........ *H01L 29/1608* (2013.01); *H01L 29/413* (2013.01); *H01L 29/41733* (2013.01); *H01L 29/41741* (2013.01); *H01L 29/42312* (2013.01); *H01L 29/66227* (2013.01); *H01L 29/78687* (2013.01); *H01L 51/0562* (2013.01); *B82Y 10/00* (2013.01); *H01L 21/02444* (2013.01); *H01L 51/0048* (2013.01)

(56) References Cited

U.S. PATENT DOCUMENTS

2011/0253982 A1   10/2011   Wang et al.
2015/0243690 A1*  8/2015   Jin ...................... H01L 27/1262
                                                          438/158

FOREIGN PATENT DOCUMENTS

TW       200845404 A    11/2008
TW       200947722 A    11/2009

* cited by examiner

SEMICONDUCTOR DEVICE

CROSS-REFERENCE TO RELATED APPLICATIONS

This application claims all benefits accruing under 35 U.S.C. § 119 from China Patent Application No. 201710375328.5, filed on May 24, 2017, in the China Intellectual Property Office, the contents of which are hereby incorporated by reference.

FIELD

The present disclosure relates to a semiconductor device.

BACKGROUND

A heterojunction is an interface region formed by a contact of two different semiconductor materials. According to the conductivity types of different semiconductor materials, the heterojunction can be divided into homogeneous heterojunction (P-p junction or N-n junction) and heterotypic heterojunction (P-n or p-N). A heterostructure can be formed by multilayer heterojunctions. The heterostructure can be used in semiconductor structure and semiconductor device.

BRIEF DESCRIPTION OF THE DRAWINGS

Implementations of the present technology will now be described, by way of example only, with reference to the attached figures, wherein.

DETAILED DESCRIPTION

Figure 1:
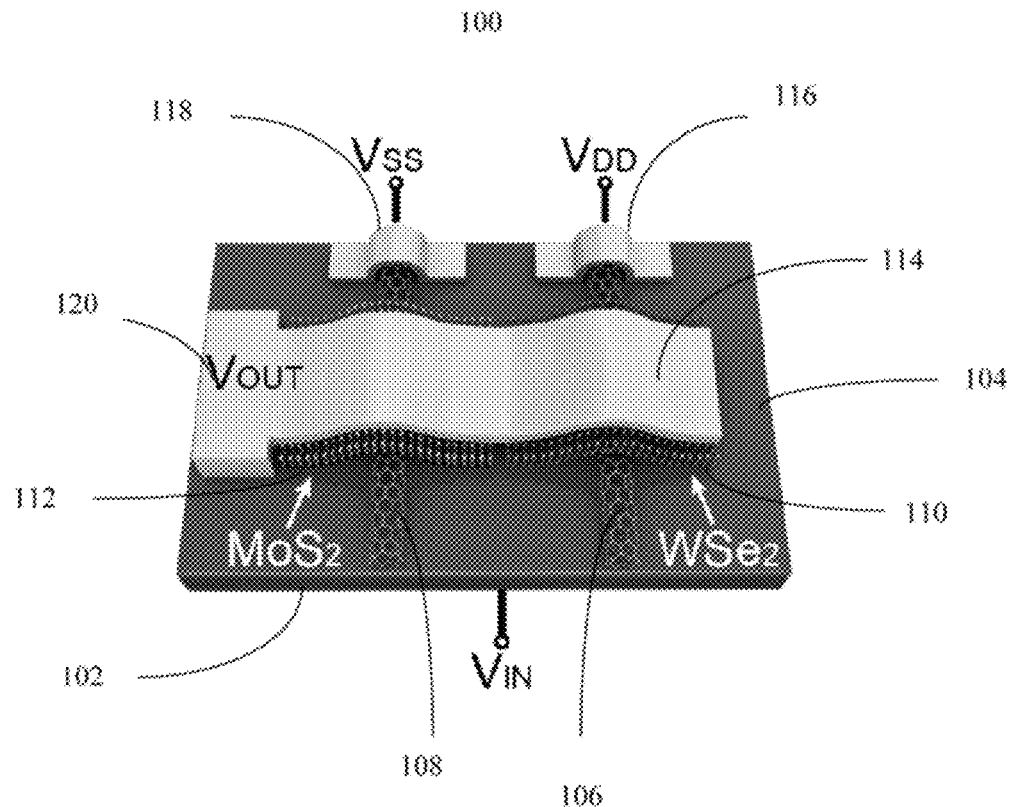
FIG. 1 is a 3D structure schematic view of a semiconductor device according to one embodiment.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Figure 2:
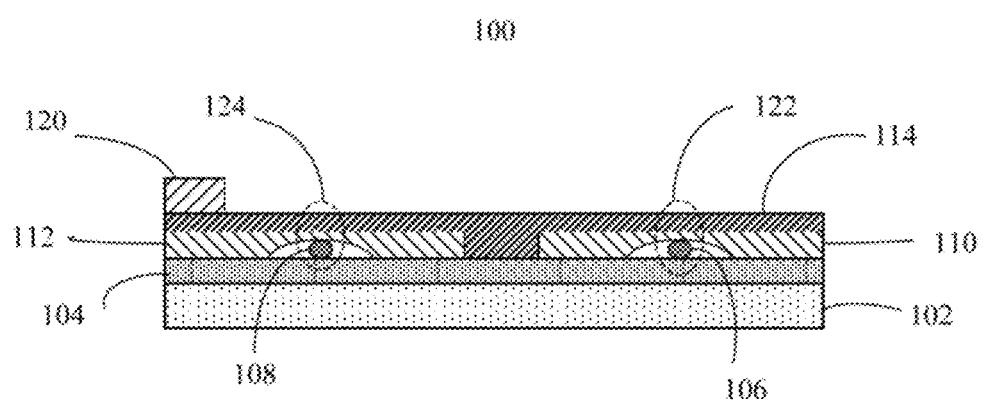
FIG. 2 is a side schematic view of the semiconductor device in FIG. 1.

Referring to FIGS. 1-2, one embodiment is described in relation to a semiconductor device 100. The semiconductor device 100 includes a gate electrode 102, an insulating layer 104, a first carbon nanotube 106, a second carbon nanotube 108, a P-type semiconductor layer 110, an N-type semiconductor layer 112, a conductive film 114, a first electrode 116, a second electrode 118 and a third electrode 120. The gate electrode 102 is a layered structure. The insulating layer 104 is located on a surface of the gate electrode 102. The first carbon nanotube 106 and the second carbon nanotube 108 are spaced apart from each other and located on a surface of the insulating layer 104. The P-type semiconductor layer 110 covers the first carbon nanotube 106 and is located on the surface of the insulating layer 104. The N-type semiconductor layer 112 covers the second carbon nanotubes 108 and is located on the surface of the insulating layer 104. The conductive film 114 is located on surfaces of the P-type semiconductor layer 110 and the N-type semiconductor layer 112. The P-type semiconductor layer 110 is located between the conductive film 114 and the first carbon nanotube 106. The N-type semiconductor layer 112 is located between the conductive film 114 and the second carbon nanotube 108. The first electrode 116 is electrically connected to the first carbon nanotube 106. The second electrode 118 is electrically connected to the second carbon nanotube 108. The third electrode 120 is electrically connected to the conductive film 114.

The gate electrode 102 is made of conductive material, such as metal, Indium Tin Oxides (ITO), Antimony Tin Oxide (ATO), conductive silver paste, carbon nanotubes or any other suitable conductive materials. The metal can be aluminum, copper, tungsten, molybdenum, gold, titanium, palladium or any combination of alloys. In one embodiment, the insulating layer 104 is located on the surface of the gate electrode 102, the first carbon nanotube 106, the second carbon nanotube 108, the P-type semiconductor layer 110, the N-type semiconductor layer 112, the conductive film 114, the first electrode 116, the second electrode 118 are all located on the surface of the insulating layer 104.

A thickness of the insulating layer 104 can be in a range from 1 nanometer to 100 microns. The first carbon nanotube 106, the second carbon nanotube 108, the P-type semiconductor layer 110 and the N-type semiconductor layer 112 are insulated from the gate electrode 102 via the insulating layer 104. In one embodiment, a material of the insulating layer 104 is $SiO_2$.

The first carbon nanotube 106 or the second carbon nanotube 108 is a metallic carbon nanotube. The first carbon nanotube 106 or the second carbon nanotube 108 can be a single-walled carbon nanotube, a double-walled carbon nanotube, or a multi-walled carbon nanotube. A diameter of the first carbon nanotube 106 or the second carbon nanotube 108 can range from about 0.5 nanometers to about 150 nanometers. In one embodiment, the diameter of the first carbon nanotube 106 or the carbon nanotube 108 ranges from about 1 nanometer to about 10 nanometers. In another embodiment, the first carbon nanotube 106 or the second carbon nanotube 108 is a single-walled carbon nanotube, and the diameter of the first carbon nanotube 106 or the second carbon nanotube 108 ranges from about 1 nanometer to about 5 nanometers. In one embodiment, both the first carbon nanotube 106 and the second carbon nanotube 108 are metallic single-walled carbon nanotubes, and the diameter of the first carbon nanotube 106 or second carbon nanotube 108 is about 1 nanometer. The first carbon nanotube 106 and the second carbon nanotube 108 are directly located on the surface of the insulating layer 104. That is, compared with the gate electrode 102 and conductive film 104, the first carbon nanotube 106 and the second carbon nanotube 108 are more close to the gate electrode 102. The conductive film 114 does not produce a shielding effect between the P-type semiconductor layer 110 and the gate electrode 102, or between the N-type semiconductor layer 112 and the gate 102. Therefore, practical application of the semiconductor device 100 is not affected. The first carbon nanotube 106 and the second carbon nanotube 108 are arranged in parallel on the surface of the insulating layer 104. A distance between the first carbon nanotube 106 and the second carbon nanotube 108 is not limited and can be adjusted according to practical application. In some embodiments, the distance between the first carbon nanotube 106 and the second carbon nanotube 108 can be 1 nanometer to 1 centimeter. Angles between the first carbon nanotube 106 and the second carbon nanotube 108 are not limited, so long as the first carbon nanotube 106 and the second carbon nanotube 108 are not in contact with each other.

The P-type semiconductor layer 110 or the N-type semiconductor layer can be a two-dimensional structure. A thickness of the P-type semiconductor layer 110 or the N-type semiconductor layer 112 can range from about 1 nanometer to about 100 nanometers. In one embodiment, the thickness of the P-type semiconductor layer 110 or the N-type semiconductor layer 112 ranges from about 1 nanometer to about 50 nanometers. A material of the P-type semiconductor layer 110 or the N-type semiconductor layer 112 can be inorganic compound semiconductors, elemental semiconductors or organic semiconductors, such as gallium arsenide, silicon carbide, polysilicon, monocrystalline silicon, naphthalene or molybdenum sulfide. In one embodiment, the material of the N-type semiconductor layer 112 is Molybdenum sulfide ($MoS_2$), and the thickness of the N-type semiconductor layer 110 is about 37 nanometers; the material of the P-type semiconductor layer 112 is Tungsten selenide (Wse2), and the thickness of the P-type semiconductor layer 110 is 22 nanometers. The P-type semiconductor layer 110 and the N-type semiconductor layer 112 are located apart from each other. The P-type semiconductor layer 110 covers the first carbon nanotube 106 and located on the surface of the insulating layer 104, the N-type semiconductor layer 112 covers the second carbon nanotube 108 and located on the surface of the insulating layer 104.

The material of the conductive film 114 is a conductive material, which may be metal, conductive polymer or ITO. The conductive film 114 is directly located on the surfaces of the P-type semiconductor layer 110 and the N-type semiconductor layer 112 away from the insulating layer 104, and the conductive film 114 covers the P-type semiconductor layer 110 and the N-type semiconductor layer 112. The P-type semiconductor layer 110 and the N-type semiconductor layer 112 are located apart from each other to form an interval, a part of the conductive film 114 at the interval between P-type semiconductor layer 110 and the N-type semiconductor layer 112 is on the surface of the insulating layer 104. That is, the conductive film 114 can be divided into three parts, one part of which is located on the surface of the P-type semiconductor layer 110 away from the insulating layer 104, one part is located on the surface of the N-type semiconductor layer 112 away from the insulating layer 104, and the other part is located on the surface of the insulating layer 104 between the P-type semiconductor layer 110 and the N-type semiconductor layer 112. The conductive film 114 is directly formed on the surfaces of the P-type semiconductor layer 110, the insulating layer 104 and the N-type semiconductor layer 112. The conductive film 114 can be formed by a depositing method or a coating method. The depositing method is not limited and can be ion sputtering or magnetron sputtering. The thickness of the conductive film 114 is not limited, and can be in a range from 5 nanometers to 100 micrometers. In some embodiments, the conductive film 114 has a thickness of 5 nanometers to 20 nanometers. A shape of the conductive film 114 is not limited, and can be long, linear, square, or the like. In one embodiment, the conductive film 114 is strip-shaped.

A first three-layered stereoscopic structure 122 can be formed by the first carbon nanotube 106, the P-type semiconductor layer 110 and the conductive film 114. A cross-sectional area of the first three-layered stereoscopic structure 122 is determined by the first carbon nanotube 106. Because the first carbon nanotube 106 is in nanoscale, the cross-sectional area of the first three-layered stereoscopic structure 122 is nanoscale. The first three-layered stereoscopic structure 122 defines a horizontal cross-sectional surface and a vertical cross-sectional surface. The horizontal cross-sectional surface is parallel with the surface the P-type semiconductor layer 110. The vertical cross-sectional surface is perpendicular with the surface of the P-type semiconductor layer 110. An area of the horizontal cross-sectional surface is determined by the diameter of the first carbon nanotube 106 and a thickness of the first three-layered stereoscopic structure 122. An area of the vertical cross-sectional surface is determined by the length of the first carbon nanotube 106 and the thickness of the first three-layered stereoscopic structure 122. In one embodiment, the cross-sectional area of horizontal cross-sectional surface or the vertical cross-sectional surface of the first three-layered stereoscopic structure 122 ranges from about 0.25 $nm^2$ to about 1000 $nm^2$. In another embodiment, the cross-sectional area ranges from about 1 $nm^2$ to about 100 $nm^2$.

A second three-layered stereoscopic structure 124 can be formed by the second carbon nanotube 108, the N-type semiconductor layer 112 and the conductive film 114. A cross-sectional area of the second three-layered stereoscopic structure 124 is determined by the second carbon nanotube 108. Because the second carbon nanotube 108 is in nanoscale, the cross-sectional area of the second three-layered stereoscopic structure 124 is nanoscale. The second three-layered stereoscopic structure 124 defines a horizontal cross-sectional surface and a vertical cross-sectional surface. The horizontal cross-sectional surface is parallel with the surface the N-type semiconductor layer 112. The vertical cross-sectional surface is perpendicular with the surface of the N-type semiconductor layer 112. An area of the horizontal cross-sectional surface is determined by the diameter of the second carbon nanotube 108 and a thickness of the second three-layered stereoscopic structure 124. An area of the vertical cross-sectional surface is determined by the length of the second carbon nanotube 108 and the thickness of the second three-layered stereoscopic structure 124. In one embodiment, the cross-sectional area of horizontal cross-sectional surface or the vertical cross-sectional surface of the second three-layered stereoscopic structure 124 ranges from about 0.25 $nm^2$ to about 1000 $nm^2$. In another embodiment, the cross-sectional area ranges from about 1 $nm^2$ to about 100 $nm^2$.

A Van der Waals heterostructure is formed in the first three-layered stereoscopic structure 122 between the first carbon nanotube 106, the P-type semiconductor layer 110 and the conductive film 114. In use of the semiconductor device 100, a Schottky junction is formed between the first carbon nanotube 106, the P-type semiconductor layer 110 and the conductive film 114 in the first three-layered stereoscopic structure 122. A current can get through the first three-layered stereoscopic structure 122. Another Van der Waals heterostructure is formed in the second three-layered stereoscopic structure 124 between the second carbon nanotube 108, the N-type semiconductor layer 112 and the conductive film 114. In use of the semiconductor device 100, a Schottky junction is formed between the second carbon nanotube 108, the N-type semiconductor layer 112 and the conductive film 114 in the second three-layered stereoscopic structure 124. A current can get through the second three-layered stereoscopic structure 124. Working parts of the semiconductor device 100 are the first three-layered stereoscopic structure 122 and the second three-layered stereoscopic structure 122. Because the first three-layered stereoscopic structure 122 and the second three-layered stereoscopic structure 122 are both nanoscale, the semiconductor device 100 can be nanoscale. The semiconductor device 100 has a lower energy consumption, a higher spatial resolution, and a higher integrity.

The first electrode 116, the second electrode 118 and the third electrode 120 are all made of conductive material, such as metal, Indium Tin Oxides (ITO), Antimony Tin Oxide (ATO), conductive silver paste, carbon nanotubes or any other suitable conductive materials. The metal can be aluminum, copper, tungsten, molybdenum, gold, titanium, palladium or any combination of alloys. In one embodiment, the first electrode 116 and the second electrode 118 are both conductive films. A thickness of the conductive film ranges from about 2 microns to about 100 microns. In one embodiment, the first electrode 116 and the second electrode 118 are Au, which has a thickness of 50 nanometers. In one embodiment, the first electrode 116 is located at one end of the first carbon nanotube 106 and adhered on a surface of the first carbon nanotube 106; the second electrode 118 is located at one end of the second carbon nanotube 108 and adhered on a surface of the second carbon nanotube 108. The third electrode 120 is bar-shaped, and located at one end of the conductive film 114 and along one side of the conductive film 114.

Figure 3:
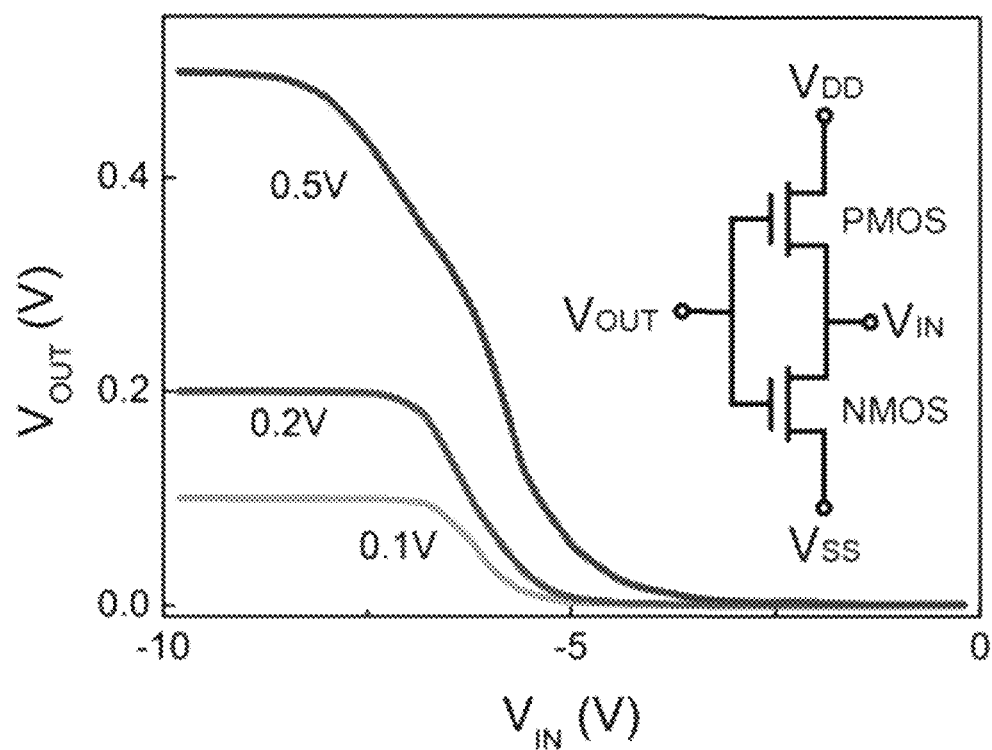
FIG. 3 is a graph showing a working characteristic curve of a COMS using the semiconductor device.

The semiconductor device 100 of the present invention includes two asymmetric Van der Waals heterostructures based on carbon nanotubes. In use of the semiconductor device 100, the Van der Waals heterostructure exhibits asymmetric output characteristics at opposite source-drain biases. The diversity of transport performance is mainly because of the fact that a Fermi level of carbon nanotube is easily modulated and the semiconductor device is asymmetrically contacted, while the carbon nanotube electrode is suitable for either electron-type or hole-type conductivity. The tunable device functionality and size limitations of lateral device make this semiconducting device of asymmetric Van der Waals heterostructure including carbon nanotubes unique and have great potential for future nanoelectronics field and nanoelectronics field. Referring to FIG. 3, when the semiconductor device 100 is used as a COMS, the gate electrode 102 is an outputting end, the third electrode is an outputting end, power source is introduced from the first electrode 112 and the second electrode 118, the three curves in the figure are outputting curves corresponding to a voltage of the power source of 0.1V, 0.2V and 0.4V. it can be seen from the FIG. 3, the COMS has a good working performance.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A semiconductor device comprising:
  a gate electrode, the gate electrode being a layered structure;
  an insulating layer located on a surface of the gate electrode;
  a first carbon nanotube and a second carbon nanotube located on a surface of the insulating layer and apart from each other;
  a P-type semiconductor layer and an N-type semiconductor layer located on the surface of the insulating layer and apart from each other, the P-type semiconductor layer covering the first carbon nanotube, the N-type semiconductor layer covering the second carbon nanotube;
  a conductive film located on surfaces of the P-type semiconductor layer and the N-type semiconductor layer, wherein the P-type semiconductor layer is located between the conductive film and the first carbon nanotube, the N-type semiconductor layer is located between the conductive film and the second carbon nanotube;
  a first electrode electrically connected with the first carbon nanotube;
  a second electrode electrically connected with the second carbon nanotube; and
  a third electrode electrically connected with the conductive film.

2. The semiconductor device of claim 1, wherein the first carbon nanotube or the second carbon nanotube is a metallic carbon nanotube.

3. The semiconductor device of claim 1, wherein the first carbon nanotube or the second carbon nanotube is a single-walled carbon nanotube, and the diameter of the first carbon nanotube or the second carbon nanotube ranges from about 1 nanometer to about 5 nanometers.

4. The semiconductor device of claim 1, wherein a thickness of the P-type semiconductor layer or the N-type semiconductor layer ranges from about 1 nanometer to about 200 nanometers.

5. The semiconductor device of claim 1, wherein a material of the P-type semiconductor layer or the N-type semiconductor layer gallium arsenide, silicon carbide, polysilicon, monocrystalline silicon, naphthalene or molybdenum sulfide.

6. The semiconductor device of claim 1, wherein the conductive film is directly formed on the surfaces of the P-type semiconductor layer and the N-type semiconductor layer.

7. The semiconductor device of claim 6, wherein the conductive film is formed by a depositing method or a coating method.

8. The semiconductor device of claim 7, wherein the depositing method comprises ion sputtering and magnetron sputtering.

9. The semiconductor device of claim 1, wherein a first three-layered stereoscopic structure is formed by the first carbon nanotube, the P-type semiconductor layer and the conductive film.

10. The semiconductor device of claim 9, wherein a cross-sectional area the first three-layered stereoscopic structure ranges from about 0.25 $nm^2$ to about 1000 $nm^2$.

11. The semiconductor device of claim 1, wherein a second three-layered stereoscopic structure is formed by the second carbon nanotube, the N-type semiconductor layer and the conductive film.

12. The semiconductor device of claim 11, wherein a cross-sectional area of the second three-layered stereoscopic structure ranges from about 0.25 $nm^2$ to about 1000 $nm^2$.

* * * * *